US011533050B1

(12) United States Patent
Xu et al.

(10) Patent No.: US 11,533,050 B1
(45) Date of Patent: Dec. 20, 2022

(54) DIFFERENTIAL BOOTSTRAPPED TRACK-AND-HOLD CIRCUIT WITH CROSS-COUPLED DUMMY SAMPLING SWITCHES

(71) Applicant: NXP USA, Inc., Austin, TX (US)

(72) Inventors: Weiwei Xu, Cupertino, CA (US); Xiaoyue Wang, San Jose, CA (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/359,462

(22) Filed: Jun. 25, 2021

(51) Int. Cl.
*H03K 17/687* (2006.01)
*H03K 3/01* (2006.01)

(52) U.S. Cl.
CPC .......... *H03K 17/6872* (2013.01); *H03K 3/01* (2013.01); *H03K 17/6874* (2013.01)

(58) Field of Classification Search
CPC ............ H03M 1/1245; H03K 17/6872; H03K 17/6874
See application file for complete search history.

(56) References Cited

U.S. PATENT DOCUMENTS

| | | | |
|---|---|---|---|
| 7,397,284 B1 | 7/2008 | Liu | |
| 8,664,979 B2 | 3/2014 | Doris et al. | |
| 8,866,541 B2 * | 10/2014 | Ali | G11C 27/02 327/551 |
| 10,295,572 B1 * | 5/2019 | Mai | H03K 17/08 |
| 11,016,524 B2 * | 5/2021 | Imaizumi | H03K 17/6872 |

OTHER PUBLICATIONS

Wang, Haitao et al. "A sample-and-hold circuit for 10-bit 100MS/S Pipelined ADC", (2011), 4 pgs.

* cited by examiner

*Primary Examiner* — Ryan Johnson
*Assistant Examiner* — Colleen J O'Toole

(57) ABSTRACT

Embodiments of a differential bootstrapped track-and-hold circuit are disclosed. In an embodiment, the differential bootstrapped track-and-hold circuit includes first and second single-ended bootstrapped track-and-hold circuits. Each single-ended bootstrapped track-and-hold circuit includes a sampling switch connected between an input terminal and an output terminal, a sampling capacitor connected to the output terminal, and a dummy sampling switch connected between the input terminal and a dummy output terminal. The sampling switch and the dummy sampling switch are controlled by a bootstrap driver connected to the input terminal. The dummy output terminal of the first single-ended bootstrapped track-and-hold circuit is connected to the output terminal of the second single-ended bootstrapped track-and-hold circuit and the dummy output terminal of the second single-ended bootstrapped track-and-hold circuit is connected to the output terminal of the first single-ended bootstrapped track-and-hold circuit to provide signals to compensate for charge injection errors at the output terminals.

19 Claims, 7 Drawing Sheets

DIFFERENTIAL BOOTSTRAPPED TRACK-AND-HOLD CIRCUIT WITH CROSS-COUPLED DUMMY SAMPLING SWITCHES

BACKGROUND

Track-and-hold or sample-and-hold circuits are commonly used to sample an input analog signal at different times using a sampling capacitor and a sampling transistor. The sampling transistor is used as a switch to selectively connect the input signal to the sampling capacitor to track and hold output for sampling. However, on-resistance of the sampling transistor may limit its performance. A bootstrap driver circuit can be used to establish a low on-resistance of the sampling transistor for a track-and-hold circuit to improve switch linearity. However, in these bootstrapped track-and-hold circuits, charge injection through the gate-source capacitor of the sampling transistor when the sampling transistor is turned off may cause errors in the sampled output signal. Furthermore, the injected charge is dependent on the input signal, which can cause linearity performance degradation of the output signal.

SUMMARY

Embodiments of a differential bootstrapped track-and-hold circuit are disclosed. In an embodiment, the differential bootstrapped track-and-hold circuit includes first and second single-ended bootstrapped track-and-hold circuits. Each single-ended bootstrapped track-and-hold circuit includes a sampling switch connected between an input terminal and an output terminal, a sampling capacitor connected to the output terminal, and a dummy sampling switch connected between the input terminal and a dummy output terminal. The sampling switch and the dummy sampling switch are controlled by a bootstrap driver connected to the input terminal. The dummy output terminal of the first single-ended bootstrapped track-and-hold circuit is connected to the output terminal of the second single-ended bootstrapped track-and-hold circuit and the dummy output terminal of the second single-ended bootstrapped track-and-hold circuit is connected to the output terminal of the first single-ended bootstrapped track-and-hold circuit to provide signals to compensate for charge injection errors at the output terminals.

In an embodiment, the differential bootstrapped track-and-hold circuit includes first and second single-ended bootstrapped track-and-hold circuits. The first single-ended bootstrapped track-and-hold circuit includes a first sampling switch connected between a first input terminal and a first output terminal, a first sampling capacitor connected to the first output terminal, and a first dummy sampling switch connected between the first input terminal and a first dummy output terminal. The first sampling switch and the first dummy sampling switch are controlled by a first bootstrap driver connected to the first input terminal. The second single-ended bootstrapped track-and-hold circuit includes a second sampling switch connected between a second input terminal and a second output terminal, a second sampling capacitor connected to the second output terminal, and a second dummy sampling switch connected between the second input terminal and a second dummy output terminal. The second sampling switch and the second dummy sampling switch are controlled by a second bootstrap driver connected to the second input terminal. The first dummy output terminal of the first single-ended bootstrapped track-and-hold circuit is connected to the second output terminal of the second single-ended bootstrapped track-and-hold circuit and the second dummy output terminal of the second single-ended bootstrapped track-and-hold circuit is connected to the first output terminal of the first single-ended bootstrapped track-and-hold circuit to provide signals from the first and second dummy sampling switches to compensate for charge injection errors at the first and second output terminals.

In an embodiment, the first dummy sampling switch of the first single-ended bootstrapped track-and-hold circuit is connected to the second output terminal of the second single-ended bootstrapped track-and-hold circuit via a first capacitor, and the second dummy sampling switch of the second single-ended bootstrapped track-and-hold circuit is connected to the first output terminal of the first single-ended bootstrapped track-and-hold circuit via a second capacitor.

In an embodiment, the first sampling switch of the first single-ended bootstrapped track-and-hold circuit is connected to receive a bootstrap signal from the first bootstrap driver, and the first dummy sampling switch of the first single-ended bootstrapped track-and-hold circuit is connected to receive a signal from a plate of a bootstrap capacitor in the first bootstrap driver.

In an embodiment, the second sampling switch of the second single-ended bootstrapped track-and-hold circuit is connected to receive a bootstrap signal from the second bootstrap driver, and the second dummy sampling switch of the second single-ended bootstrapped track-and-hold circuit is connected to receive a signal from a plate of a bootstrap capacitor in the second bootstrap driver.

In an embodiment, the first single-ended bootstrapped track-and-hold circuit includes a first cascode sampling switch connected in series with the first sampling switch and a first cascode dummy sampling switch connected in series with the first dummy sampling switch.

In an embodiment, the first cascode sampling switch of the first single-ended bootstrapped track-and-hold circuit is connected to receive a signal from a first plate of a first bootstrap capacitor in the first bootstrap driver, and the first cascode dummy sampling switch of the first single-ended bootstrapped track-and-hold circuit is connected to receive a signal from a second plate of the first bootstrap capacitor in the first bootstrap driver.

In an embodiment, the second single-ended bootstrapped track-and-hold circuit includes a second cascode sampling switch connected in series with the second sampling switch and a second cascode dummy sampling switch connected in series with the second dummy sampling switch.

In an embodiment, the second cascode sampling switch of the second single-ended bootstrapped track-and-hold circuit is connected to receive a signal from a first plate of a second bootstrap capacitor in the second bootstrap driver, and the second cascode dummy sampling switch of the second single-ended bootstrapped track-and-hold circuit is connected to receive a signal from a second plate of the second bootstrap capacitor in the second bootstrap driver.

In an embodiment, the first bootstrap driver includes a first bootstrap capacitor having a first plate connected to the first input terminal via a first transistor in the first bootstrap driver and having a second plate connected to the first sampling switch via a second transistor in the first bootstrap driver.

In an embodiment, the second bootstrap driver includes a second bootstrap capacitor having a first plate connected to the second input terminal via a first transistor in the second bootstrap driver and having a second plate connected to the first sampling switch via a second transistor in the second bootstrap driver.

In an embodiment, the first sampling switch, the first dummy sampling switch, the second sampling switch and the second dummy sampling switch are transistors.

In an embodiment, the first sampling switch, the first dummy sampling switch, the second sampling switch and the second dummy sampling switch are NMOS transistors.

In an embodiment, the differential bootstrapped track-and-hold circuit includes first and second single-ended bootstrapped track-and-hold circuits. The first single-ended bootstrapped track-and-hold circuit includes a first sampling transistor connected between a first input terminal and a first output terminal, a first sampling capacitor connected to the first output terminal and ground, and a first dummy sampling transistor connected between the first input terminal and a first dummy output terminal. The first sampling transistor and the first dummy sampling transistor are controlled by a first bootstrap driver connected to the first input terminal. The second single-ended bootstrapped track-and-hold circuit includes a second sampling transistor connected between a second input terminal and a second output terminal, a second sampling capacitor connected to the second output terminal and ground, and a second dummy sampling transistor connected between the second input terminal and a second dummy output terminal. The second sampling transistor and the second dummy sampling transistor are controlled by a second bootstrap driver connected to the second input terminal. The first dummy output terminal of the first single-ended bootstrapped track-and-hold circuit is connected to the second output terminal of the second single-ended bootstrapped track-and-hold circuit via a first capacitor and the second dummy output terminal of the second single-ended bootstrapped track-and-hold circuit is connected to the first output terminal of the first single-ended bootstrapped track-and-hold circuit via a second capacitor to provide signals from the first and second dummy sampling transistors to compensate for charge injection errors at the first and second output terminals.

In an embodiment, the first sampling transistor of the first single-ended bootstrapped track-and-hold circuit is connected to receive a bootstrap signal from the first bootstrap driver, and the first dummy sampling transistor of the first single-ended bootstrapped track-and-hold circuit is connected to receive a signal from a plate of a bootstrap capacitor in the first bootstrap driver.

In an embodiment, the first single-ended bootstrapped track-and-hold circuit includes a first cascode sampling transistor connected in series with the first sampling transistor and a first cascode dummy sampling transistor connected in series with the first dummy sampling transistor.

In an embodiment, the first cascode sampling transistor of the first single-ended bootstrapped track-and-hold circuit is connected to receive a signal from a first plate of a first bootstrap capacitor in the first bootstrap driver, and the first cascode dummy sampling transistor of the first single-ended bootstrapped track-and-hold circuit is connected to receive a signal from a second plate of the first bootstrap capacitor in the first bootstrap driver.

In an embodiment, the second single-ended bootstrapped track-and-hold circuit includes a second cascode sampling transistor connected in series with the second sampling transistor and a second cascode dummy sampling transistor connected in series with the second dummy sampling transistor.

In an embodiment, the first bootstrap driver includes a first bootstrap capacitor having a first plate connected to the first input terminal via a first transistor in the first bootstrap driver and having a second plate connected to the first sampling transistor via a second transistor in the first bootstrap driver.

In an embodiment, the differential bootstrapped track-and-hold circuit includes first and second single-ended bootstrapped track-and-hold circuits. The first single-ended bootstrapped track-and-hold circuit includes a first sampling transistor connected between a first input terminal and a first output terminal, a first sampling capacitor between the first output terminal and ground, and a first dummy sampling transistor connected between the first input terminal and a first dummy output terminal. The first single-ended bootstrapped track-and-hold circuit further includes a first bootstrap driver connected to the first input terminal and gates of the first sampling transistor and the first dummy sampling transistor. The second single-ended bootstrapped track-and-hold circuit includes a second sampling transistor connected between a second input terminal and a second output terminal, a second sampling capacitor between the second output terminal and ground, and a second dummy sampling transistor connected between the second input terminal and a second dummy output terminal. The second single-ended bootstrapped track-and-hold circuit further includes a second bootstrap driver connected to the second input terminal and gates of the second sampling transistor and the second dummy sampling transistor. The first dummy output terminal of the first single-ended bootstrapped track-and-hold circuit is connected to the second output terminal of the second single-ended bootstrapped track-and-hold circuit via a first capacitor and the second dummy output terminal of the second single-ended bootstrapped track-and-hold circuit is connected to the first output terminal of the first single-ended bootstrapped track-and-hold circuit via a second capacitor to produce signals to compensate for charge injection errors at the first and second output terminals In an embodiment, the gate of the first sampling transistor of the first single-ended bootstrapped track-and-hold circuit is connected to receive a bootstrap signal from the first bootstrap driver, and the gate of the first dummy sampling transistor of the first single-ended bootstrapped track-and-hold circuit is connected to receive a signal from a plate of a bootstrap capacitor in the first bootstrap driver.

These and other aspects in accordance with embodiments will become apparent from the following detailed description, taken in conjunction with the accompanying drawings, illustrated by way of example of the principles of the embodiments.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended Figs. could be arranged and designed in a wide variety of different configurations. Thus, the following more detailed description of various embodiments, as represented in the Figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the embodiments is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Figure 1:
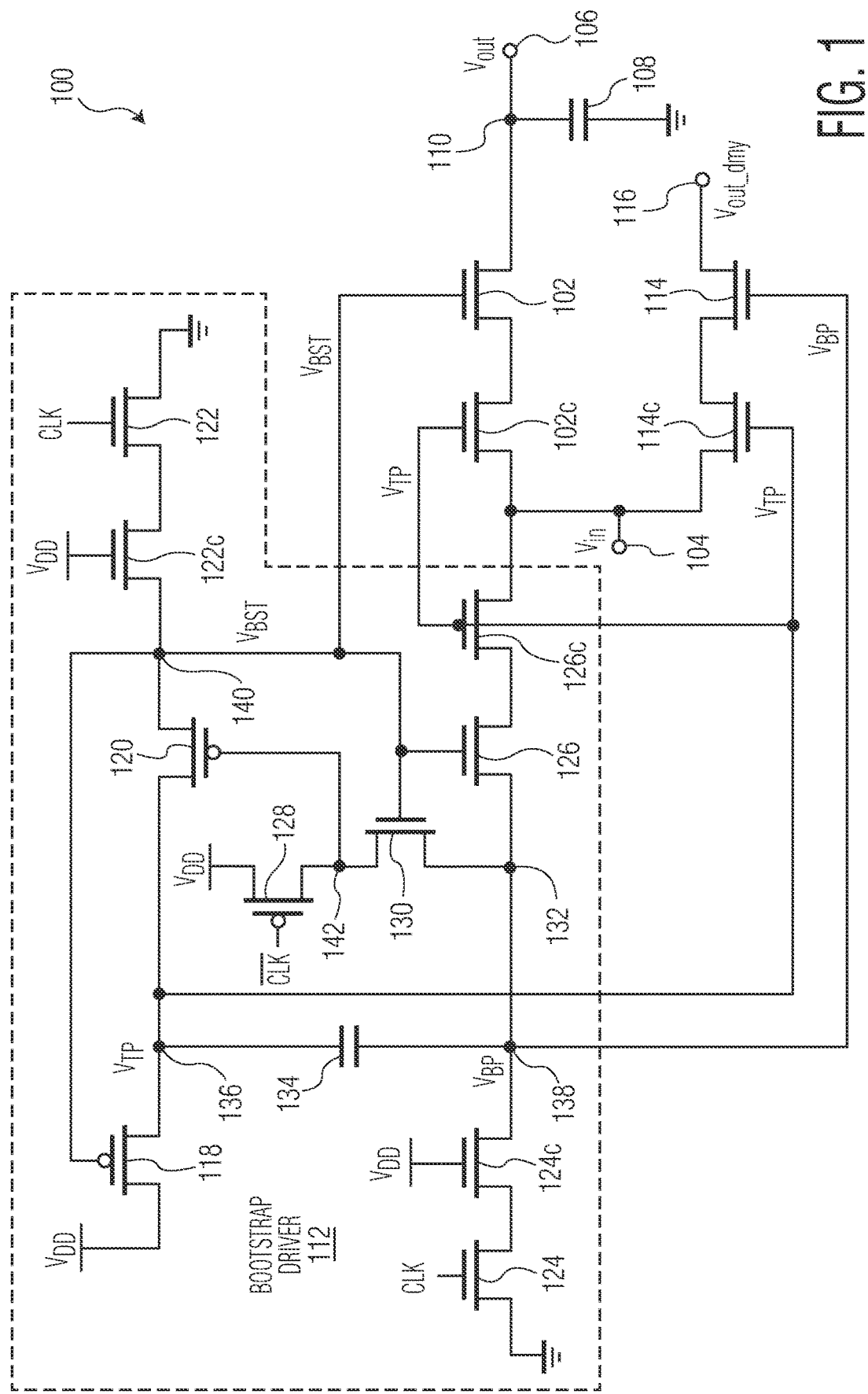
FIG. 1 is a schematic diagram of a single-ended bootstrapped track-and-hold (T/H) circuit in accordance with an embodiment of the invention.

FIG. 1 is a schematic diagram of a single-ended bootstrapped track-and-hold (T/H) circuit 100 in accordance with an embodiment of the invention is shown. In the illustrated embodiment, transistors of the bootstrapped T/H circuit 100 are shown as being metal-oxide-semiconductor field-effect transistors (MOSFETs). However, in other embodiments, the bootstrapped T/H circuit 100 may use other types of transistors, such as bipolar junction transistors (BJTs).

The bootstrapped T/H circuit 100 includes a sampling transistor 102 connected between an input terminal 104 and an output terminal 106, which operates as a switch. A sampling capacitor 108 is connected to a node 110, which is located between the sampling transistor 102 and the output terminal 106, and to ground. A bootstrap driver 112 is also connected to the sampling transistor 102, which provides a bootstrapped signal $V_{BST}$ to the gate of the sampling transistor 102. The sampling transistor 102 is connected in series with a cascode sampling transistor 102c. The bootstrapped T/H circuit 100 further includes a dummy sampling transistor 114 and a cascode dummy sampling transistor 114c, which are similar to the sampling transistors 102 and 102c. The dummy sampling transistors 114 and 114c are connected between the input terminal 104 and a dummy output terminal 116. The signal on the dummy output terminal 116 is illustrated as Vout_dmy. As explained in detail below, these dummy sampling transistors 114 and 114c operate to cancel or reduce charge injection error in a differential implementation of the bootstrapped T/H circuit 100.

The bootstrap driver 112 includes a first set of transistors 118, 120, 122 and 122c connected in series between a supply voltage $V_{DD}$ and ground, a second set of transistors 124, 124c, 126 and 126c connected in series between the input terminal 104 and ground, and a third set of transistors 128 and 130 connected in series between the supply voltage $V_{DD}$ and a node 132 between the transistors 124c and 126. The transistors 122c, 124c and 126c are cascode transistors, which are added for stress protection. The bootstrap driver 112 further includes a bootstrapping capacitor 134 connected to a node 136 between the transistors 118 and 120 and to a node 138 between the transistors 124c and 126. Voltages on the nodes 136 and 138 are $V_{TP}$ and $V_{BP}$, respectively, which are voltages at top and bottom plates of the capacitor 134.

In the first set of transistors, the gate of the transistor 118 is connected to a node 140 between the transistors 120 and 122c, which is also connected to the gates of the transistors 126 and 130, as well as the gate of the sampling transistor 102. The voltage at the node 140 is the bootstrapped voltage $V_{BST}$. The gate of the transistor 120 is connected to a node 142 between the transistors 128 and 130. The gate of the transistor 122c is connected to the supply voltage $V_{DD}$, while the gate of the transistor 122 is connected to receive a clock signal CLK.

In the second set of transistors, the gate of the transistor 126c is connected to the node 136 to receive the voltage $V_{TP}$. The gate of the transistor 126 is connected to the node 140 to receive the bootstrapped voltage $V_{BST}$. The gate of the transistor 124c is connected to the supply voltage $V_{DD}$, while the gate of the transistor 124 is connected to receive the clock signal CLK.

In the third set of transistors, the gate of the transistor 128 is connected to receive a clock signal $\overline{CLK}$, which is the inverse signal of the clock signal CLK. The gate of the transistor 130 is connected to the node 140 to receive the bootstrapped voltage $V_{BST}$.

In the illustrated embodiment, the transistors 102, 102c, 114, 114c, 122, 122c, 124, 124c, 126, 126c and 130 are N channel MOSFETs or NMOS transistors and the transistors 118, 120 and 128 are P channel MOSFETs or PMOS transistors. However, in other embodiments, these transistors may be other types of transistors.

Figure 2:
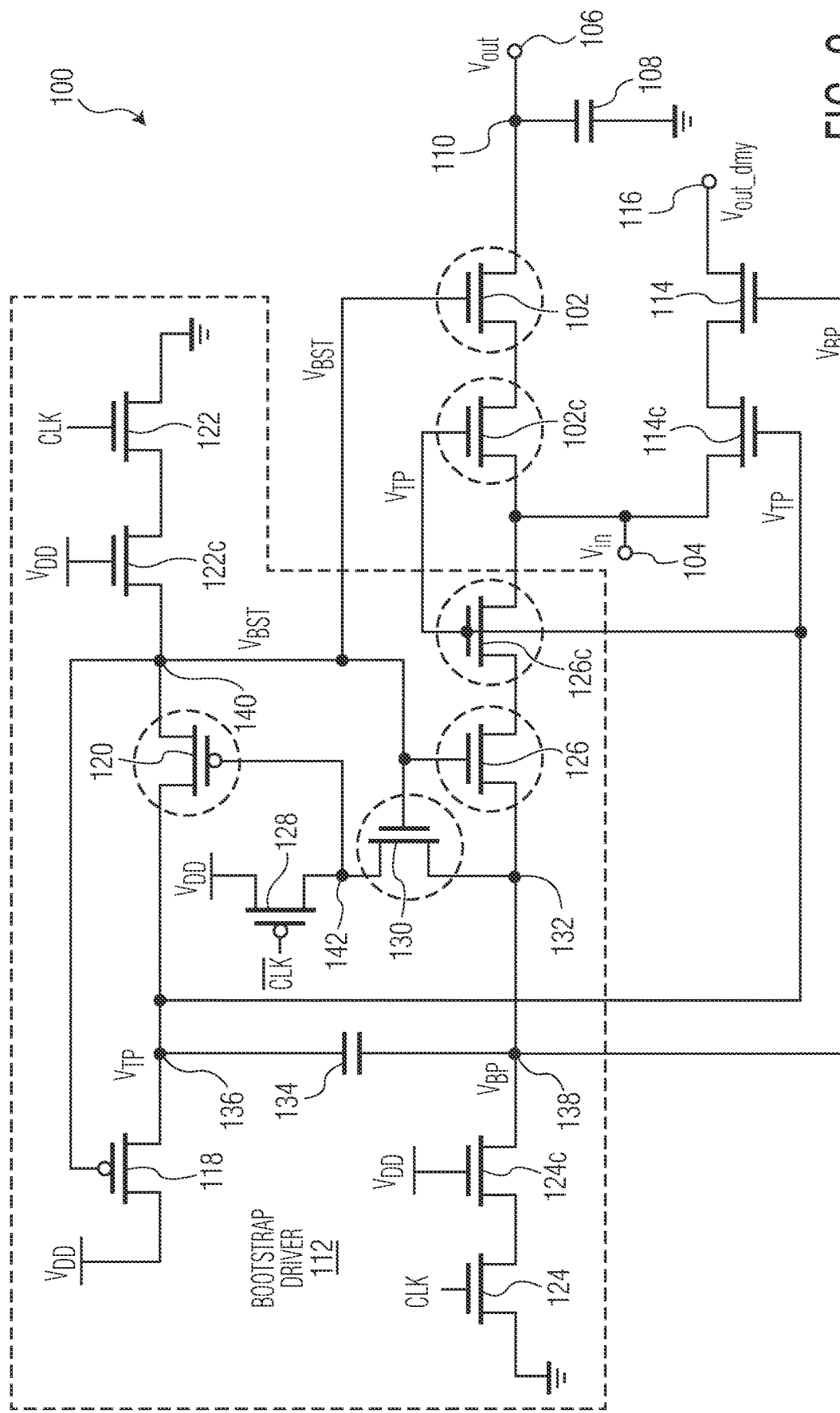
FIG. 2 illustrates the single-ended bootstrapped T/H circuit of FIG. 1 during the sample phase in accordance with an embodiment of the invention.
Figure 3:
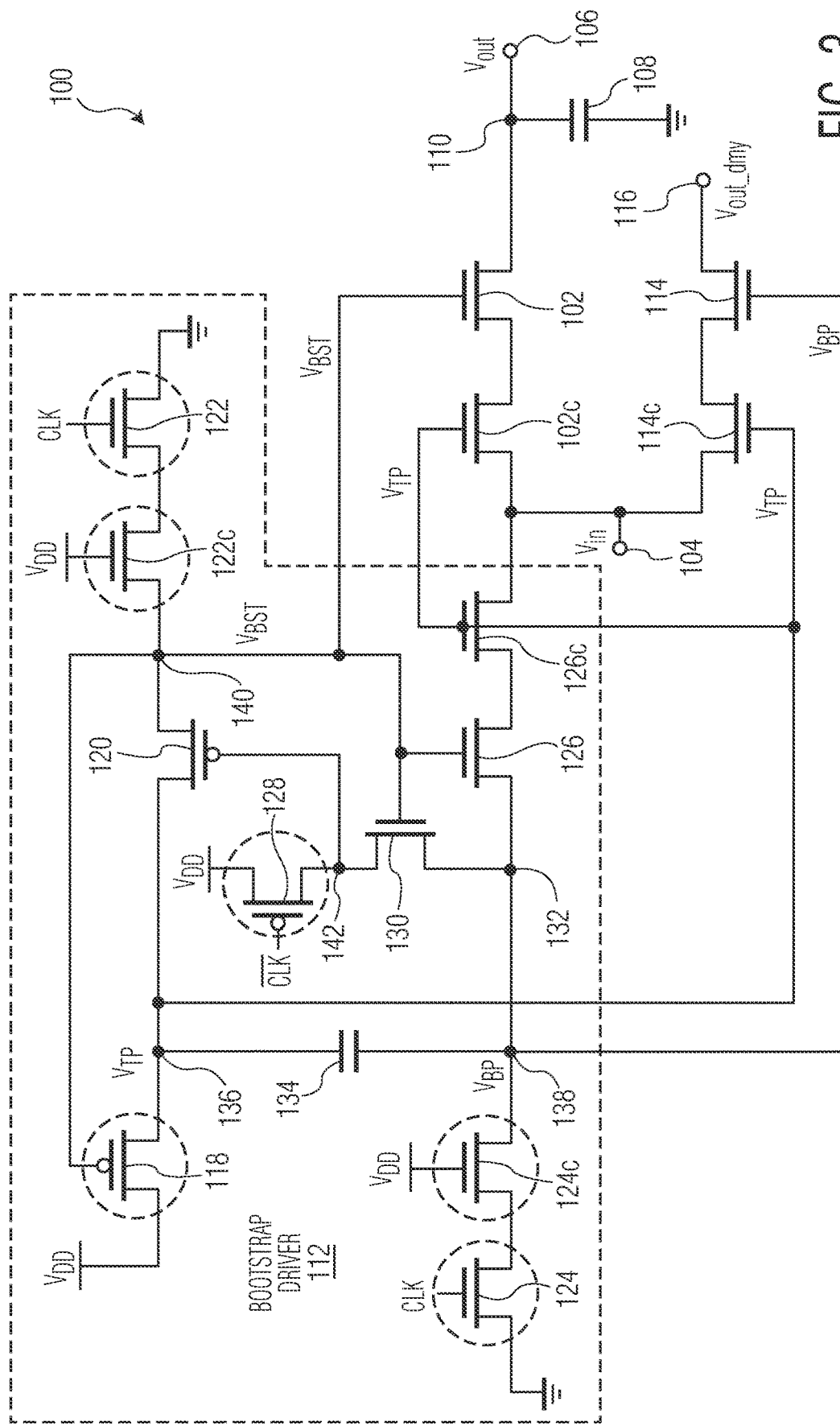
FIG. 3 illustrates the single-ended bootstrapped T/H circuit of FIG. 1 during the hold phase in accordance with an embodiment of the invention.

The operation of the bootstrapped T/H circuit 100 is controlled by the clock signals CLK and $\overline{CLK}$. Thus, the clocks signals CLK and $\overline{CLK}$ determine whether the bootstrapped T/H circuit 100 is operating in a sample phase or in a hold phase. During the sample phase, the clock signals CLK and $\overline{\text{CLK}}$ selectively turn on and turn off the transistors of the bootstrapped T/H circuit 100 to allow an input signal $V_{in}$ on the input terminal 104 to charge the sampling capacitor 108, which is illustrated in FIG. 2 in accordance with an embodiment of the invention. During the hold phase, the clock signals CLK and $\overline{\text{CLK}}$ selectively turn on and turn off different transistors of the bootstrapped T/H circuit 100 to hold the charge in the sampling capacitor 108, which is illustrated in FIG. 3 in accordance with an embodiment of the invention. The charge in the sampling capacitor 108 can then be sampled as voltage $V_{out}$ on the output terminal 106.

As illustrated in FIG. 2, during the sample phase, the clock signal CLK is low, i.e., CLK=0, and the clock signal $\overline{\text{CLK}}$ is high, i.e., $\overline{\text{CLK}}$=1. As a result, the transistors 120, 126, 126c and 130 in the bootstrapped driver 112 are turned on, as illustrated by the dotted circles. In this state, the voltage $V_{TP}$ at the node 136 is the supply voltage $V_{DD}$ plus voltage of the input signal $V_{in}$ at the input terminal 104, i.e., $V_{TP}=V_{DD}+V_{in}$. The voltage $V_{BP}$ at the node 138 is equal to the input voltage $V_{in}$, i.e., $V_{BP}=V_{in}$. Thus, the bootstrapped voltage $V_{BST}$ at the gate of the sampling transistor 102 is the supply voltage $V_{DD}$ plus the input voltage $V_{in}$, i.e., $V_{BST}=V_{DD}+V_{in}$, which turns on the sampling transistor 102. Since the voltage at the gate of the cascode sampling transistor 102C is the voltage $V_{TP}$, which is $V_{DD}+V_{in}$, the cascode sampling transistor 102C is also turned on. This voltage $V_{TP}$ is also at the gate of the cascode dummy sampling transistor 114c. The voltage $V_{BP}$ at the gate of the dummy sampling transistor 114 is the input voltage $V_{in}$, i.e., $V_{BP}+V_{in}$. However, the dummy transistors 114 and 114c do not turn on. Thus, the dummy transistors 114 and 114c do not allow DC signal components to be transmitted, but do allow AC signal components to be transmitted.

As illustrated in FIG. 3, during the hold phase, the clock signal CLK is high, i.e., CLK=1, and the clock signal $\overline{\text{CLK}}$ is low, i.e., $\overline{\text{CLK}}$=0. As a result, the transistors 118, 122, 122c, 124, 124c and 128 in the bootstrapped driver 112 are turned on, as illustrated by the dotted circles. In this state, the voltage $V_{TP}$ at the node 136 is the supply voltage $V_{DD}$, i.e., $V_{TP}=V_{DD}$. The voltage $V_{BP}$ at the node 138 is the negative supply voltage $V_{SS}$ (ground), i.e., $V_{BP}=V_{SS}$. Thus, the bootstrapped voltage $V_{BST}$ at the gate of the sampling transistor 102 is also the negative supply voltage $V_{SS}$, i.e., $V_{BST}=V_{SS}$, which turns off the sampling transistor 102. Since the voltage at the gate of the cascode sampling transistor 102c is the voltage $V_{TP}$, which is $V_{DD}$, the cascode sampling transistor 102c is also turned off. The voltage $V_{TP}$ is also at the gate of the cascode dummy sampling transistor 114c. The voltage $V_{BP}$ at the gate of the dummy sampling transistor 114 is the negative supply voltage $V_{SS}$, i.e., $V_{BP}=V_{SS}$.

Figure 4:
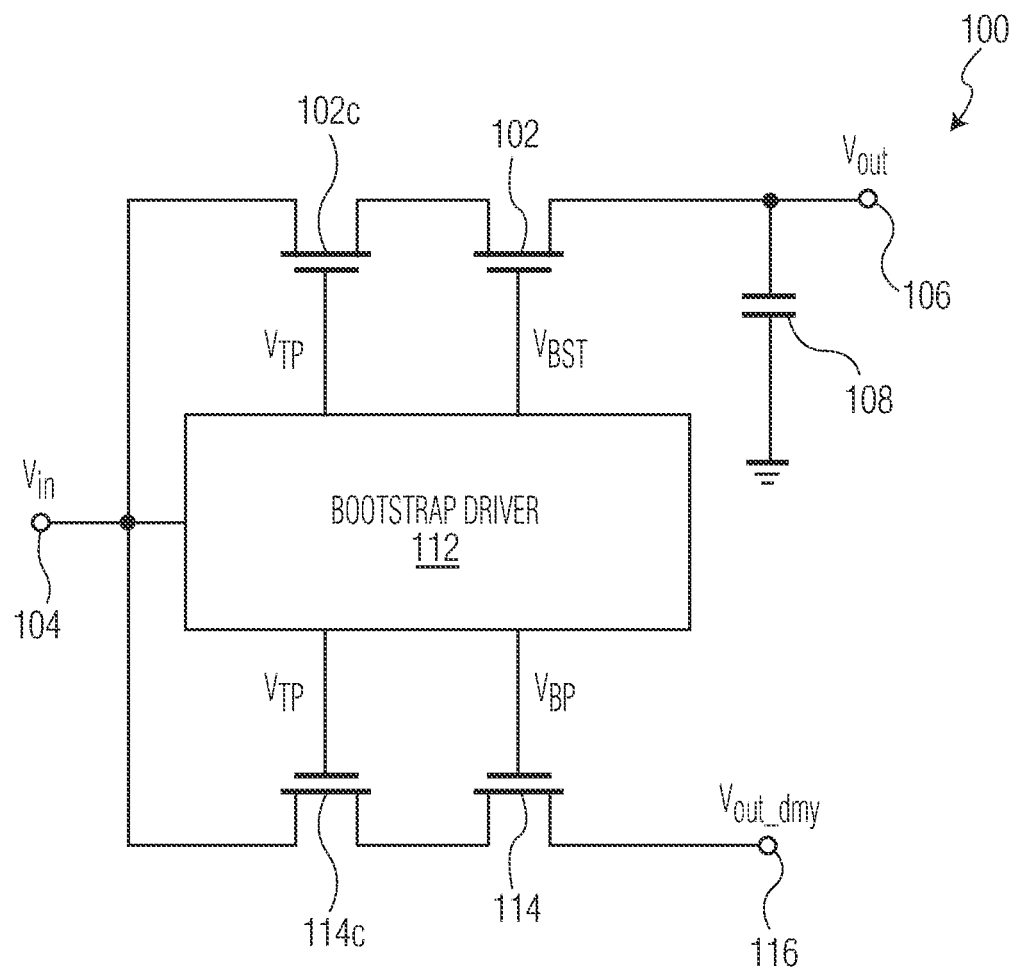
FIG. 4 is a simplified diagram of the single-ended bootstrapped T/H circuit of FIG. 1.

Turning now to FIG. 4, a simplified diagram of the single-ended bootstrapped T/H circuit 100 is shown. In FIG. 4, the bootstrap driver 112 is illustrated as a box without showing the individual components. However, the voltages $V_{BST}$, $V_{TP}$ and $V_{BP}$ generated by the bootstrap driver 112 are illustrated. The single-ended bootstrapped T/H circuit 100 shown in FIG. 4 may be implemented in a differential configuration.

Figure 5:
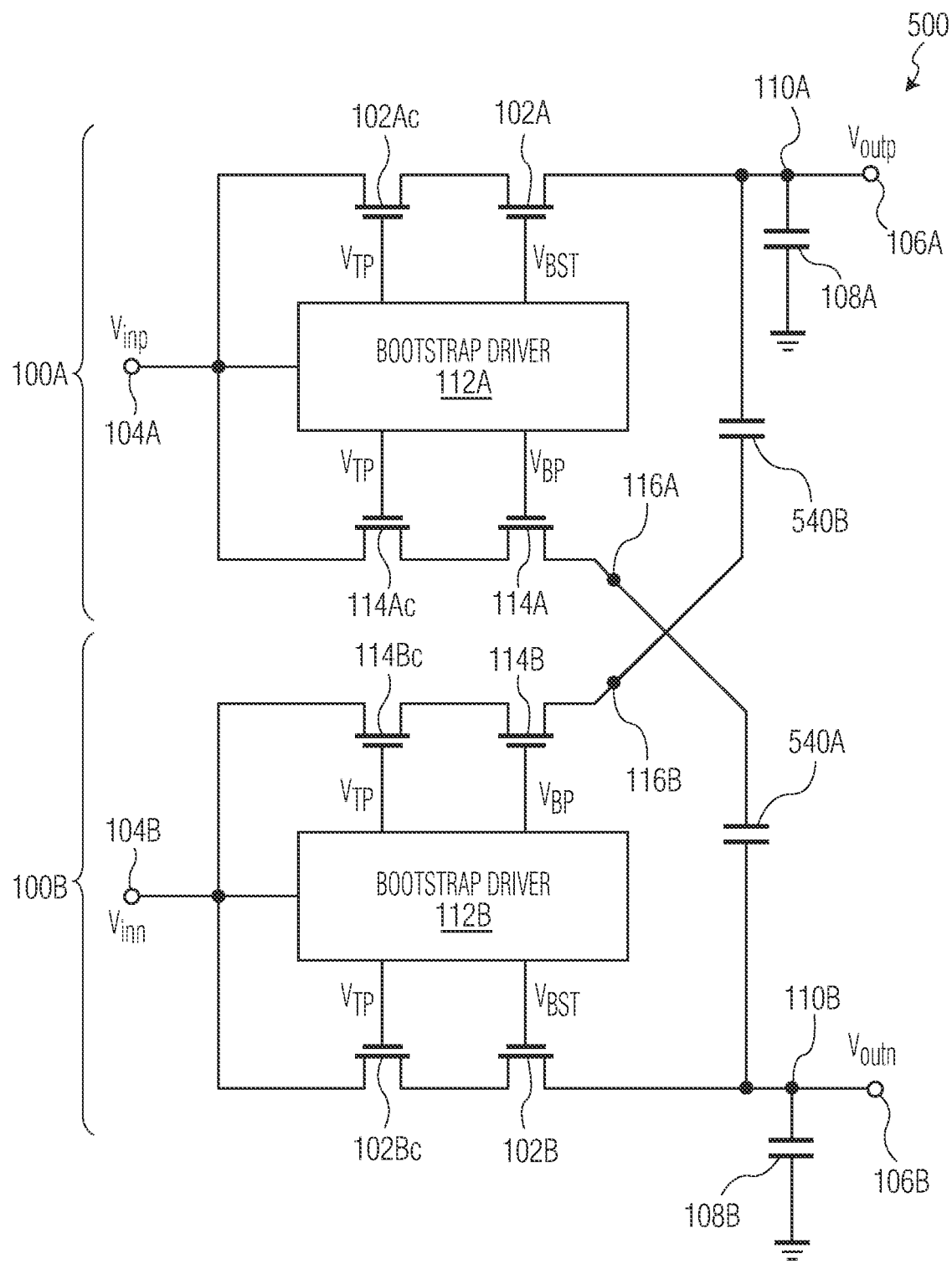
FIG. 5 is a diagram of a differential bootstrapped T/H circuit in accordance with an embodiment of the invention.

In FIG. 5, a differential bootstrapped T/H circuit 500 in accordance with an embodiment of the invention is shown. As shown in FIG. 5, the differential bootstrapped T/H circuit 500 includes two single-ended bootstrapped T/H circuits 100A and 100B, which are similar to the single-ended bootstrapped T/H circuit 100 shown in FIG. 4. Thus, the first single-ended bootstrapped T/H circuit 100A includes a sampling transistor 102A and a cascode sampling transistor 102Ac that are connected between an input terminal 104A and an output terminal 106A. A sampling capacitor 108A is connected to a node 110A, which is located between the sampling transistor 102A and the output terminal 106A, and to ground. The first bootstrapped T/H circuit 100A also includes a dummy sampling transistor 114A and a cascode dummy sampling transistor 114Ac, which are similar to the sampling transistors 102A and 102Ac. The dummy sampling transistors 114A and 114Ac are connected between the input terminal 104A and a dummy output terminal 116A. The first single-ended bootstrapped T/H circuit 100A further includes a bootstrap driver 112A, which is connected to the input terminal 104A and the main and dummy sampling transistors 102A, 102Ac, 114A and 114Ac. The bootstrap driver 112A provides the bootstrapped signal $V_{BST}$ to the gate of the sampling transistor 102A and the signal $V_{TP}$ to the gate of the cascode sampling transistor 102Ac. The bootstrap driver 112A also provides the signal $V_{BP}$ to the gate of the dummy sampling transistor 114A and the signal $V_{TP}$ to the gate of the cascode dummy sampling transistor 114Ac. In an embodiment, the bootstrap driver 112A is identical to the bootstrap driver 112 shown in FIG. 1.

Similarly, the second single-ended bootstrapped T/H circuit 100B includes a sampling transistor 102B and a cascode sampling transistor 102Bc that are connected between an input terminal 104B and an output terminal 106B. A sampling capacitor 108B is connected to a node 110B, which is located between the sampling transistor 102B and the output terminal 106B, and to ground. The second bootstrapped T/H circuit 100B also includes a dummy sampling transistor 114B and a cascode dummy sampling transistor 114Bc, which are similar to the sampling transistors 102B and 102Bc. The dummy sampling transistors 114B and 114Bc are connected between the input terminal 104B and a dummy output terminal 116B. The second single-ended bootstrapped T/H circuit 100B further includes a bootstrap driver 112B, which is connected to the input terminal 104B and the sampling and dummy sampling transistors 102B, 102Bc, 114B and 114Bc. The bootstrap driver 112B provides the bootstrapped signal $V_{BST}$ to the gate of the sampling transistor 102B and the signal $V_{TP}$ to the gate of the cascode sampling transistor 102Bc. The bootstrap driver 112B also provides the signal $V_{BP}$ to the gate of the dummy sampling transistor 114B and the signal $V_{TP}$ to the gate of the cascode dummy sampling transistor 114Bc. In an embodiment, the bootstrap driver 112B is identical to the bootstrap driver 112 shown in FIG. 1. It is noted here that the signals $V_{BST}$, $V_{TP}$ and $V_{BP}$ from the bootstrap driver 112B will not be same as the signals $V_{BST}$, $V_{TP}$ and $V_{BP}$ from the bootstrap driver 112A since different signal components of a differential input signal will be applied to the single-ended bootstrapped T/H circuits 100A and 100B. Specifically, a differential input signal component $V_{inp}$ is applied to the first single-ended bootstrapped T/H circuits 100A, while a differential input signal component $V_{inn}$ is applied to the second single-ended bootstrapped T/H circuits 100B.

As shown in FIG. 5, the dummy output terminal 116A of the first single-ended bootstrapped T/H circuit 100A is connected to the output terminal 106B of the second single-ended bootstrapped T/H circuit 100B via a capacitor 540A. Similarly, the dummy output terminal 116B of the second single-ended bootstrapped T/H circuit 100B is connected to the output terminal 106A of the first single-ended bootstrapped T/H circuit 100A via a capacitor 540B. Thus, the dummy sampling transistors 114A, 114Ac, 114B and 114Bc of the first and second single-ended bootstrapped T/H circuits 100A and 100B are in a cross-coupled configuration.

Figure 6:
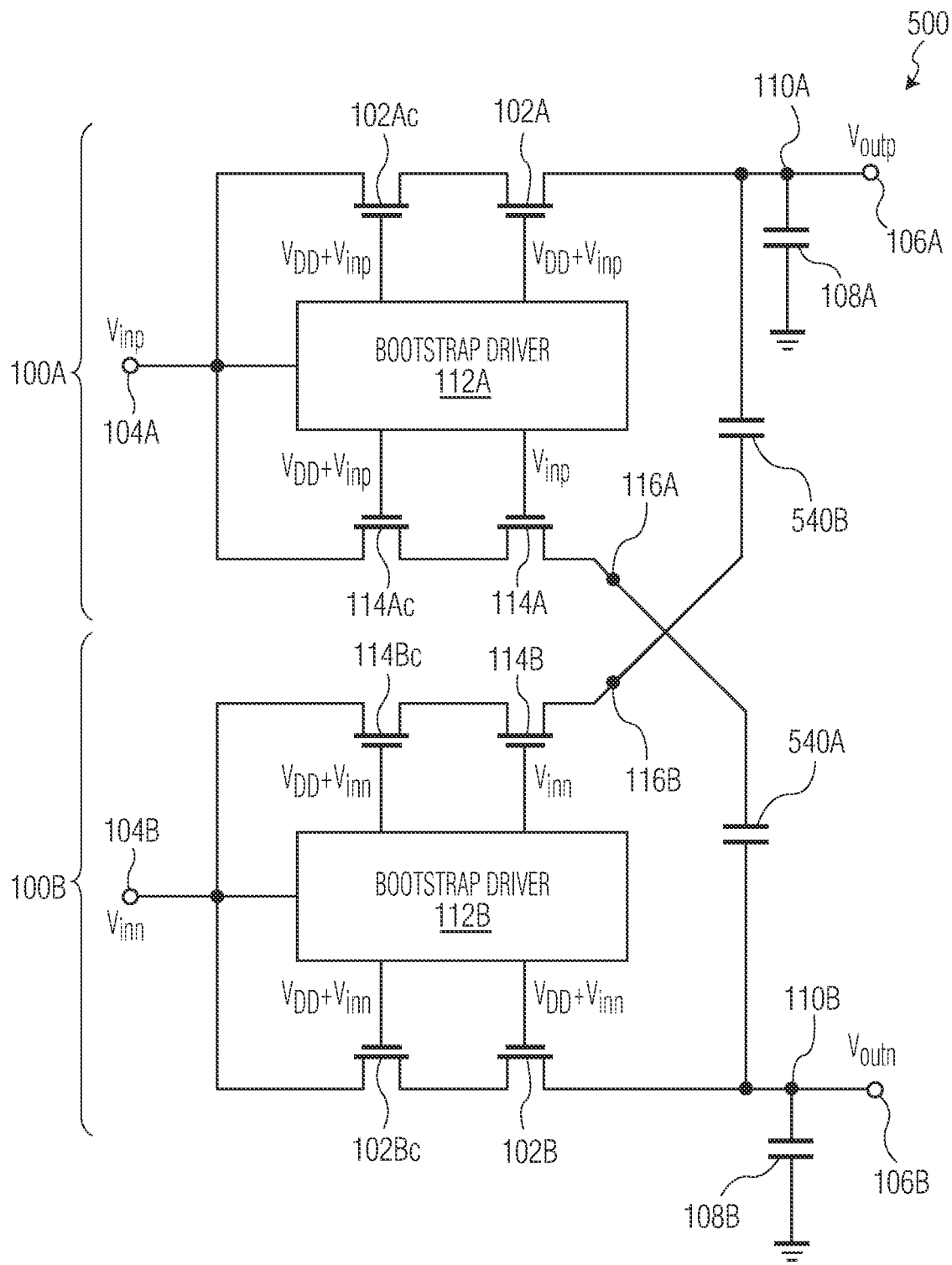
FIG. 6 illustrates the differential bootstrapped T/H circuit of FIG. 5 during the sample phase in accordance with an embodiment of the invention.

As illustrated in FIG. 6, during the sample phase, the clock signal CLK is high, i.e., CLK=1, and the clock signal $\overline{CLK}$ is low, i.e., $\overline{CLK}$=0, which selectively turn on and turn off transistors in the first and second single-ended bootstrapped T/H circuits 100A and 100B, as illustrated in FIG. 2. Thus, signals provided by the bootstrap drivers 112A and 112B are as follows: $V_{TP}=V_{DD}+V_{in}$, $V_{BST}=V_{DD}+V_{in}$, and $V_{BP}+V_{in}$. These signals with respect to the differential input signal components $V_{inp}$ and $V_{inn}$ are illustrated in FIG. 6.

Figure 7:
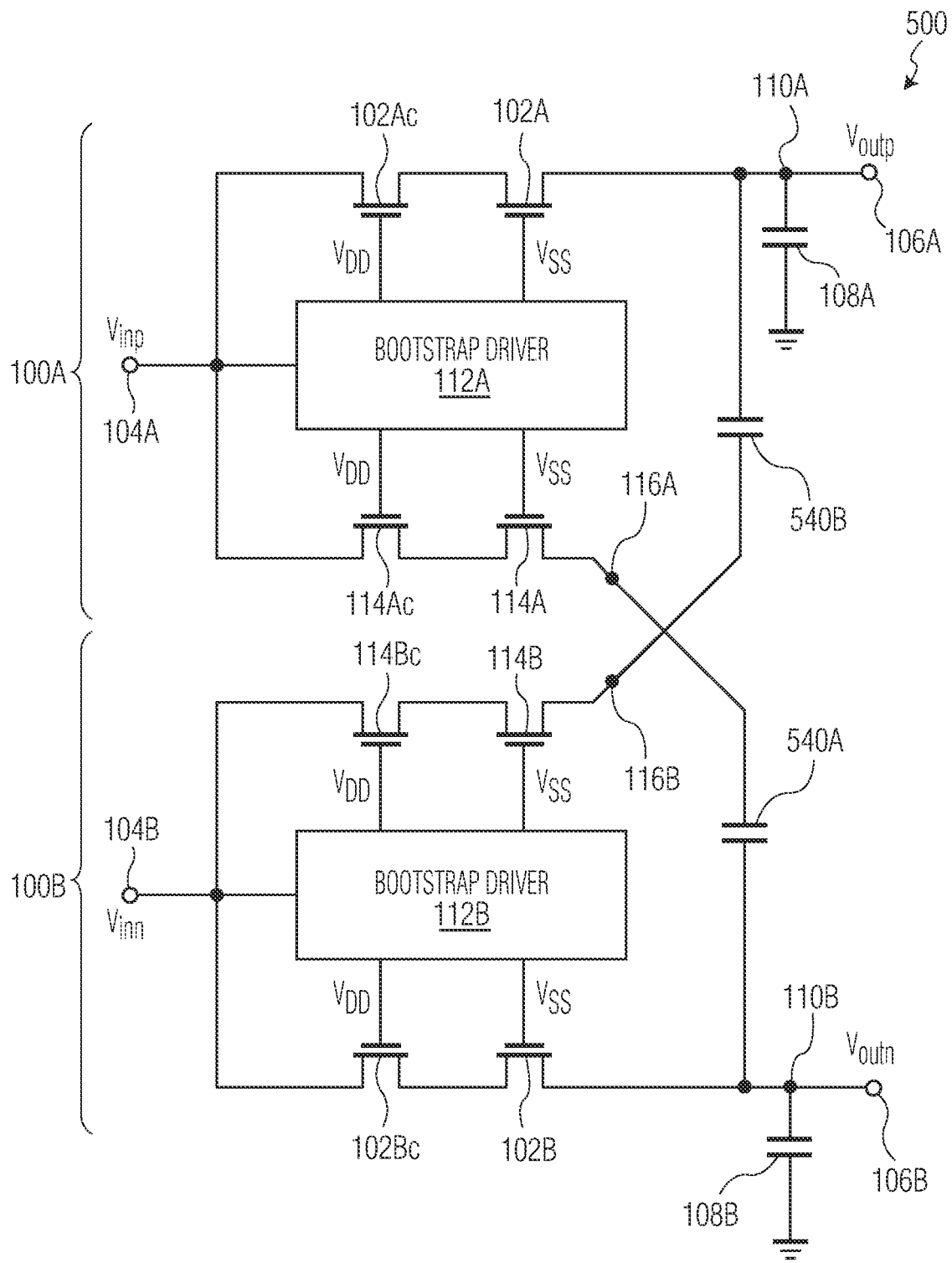
FIG. 7 illustrates the differential bootstrapped T/H circuit of FIG. 5 during the hold phase in accordance with an embodiment of the invention.

As illustrated in FIG. 7, during the hold phase, the clock signal CLK is low, i.e., CLK=0, and the clock signal $\overline{CLK}$ is high, i.e., $\overline{CLK}$=1, which selectively turn on and turn off transistors in the first and second single-ended bootstrapped T/H circuits 100A and 100B, as illustrated in FIG. 3. Thus, signals provided by the bootstrap drivers 112A and 112B are as follows: $V_{TP}=V_{DD}$, $V_{BST}=V_{SS}$, and $V_{BP}=V_{SS}$. These signals with respect to the differential input signal components $V_{inp}$ and $V_{inn}$ are illustrated in FIG. 7.

In the first single-ended bootstrapped T/H circuit 100A, during the transitions between the sample phase and the hold phase, charge injection through the gate-source capacitor Cgs of the sampling transistor 102A and the gate-source capacitor Cgs of the cascode sampling transistor 102Ac may introduce errors in the output signal $V_{outp}$ at the output terminal 106A. Similarly, in the second single-ended bootstrapped T/H circuit 100B, during the transitions between the sample phase and the hold phase, charge injection through the gate-source capacitor Cgs of the sampling transistor 102B and the gate-source capacitor Cgs of the cascode sampling transistor 102Bc may introduce errors in the output signal $V_{outn}$ at the output terminal 106B. However, these charge injection errors at the output terminals 106A and 106B are compensated by inverse charge injection signals from the dummy output terminals 116B and 116A, respectively. Specifically, the charge injection error at the output terminal 106A of the first single-ended bootstrapped T/H circuit 100A is compensated by the signal from the dummy output terminal 116B of the second single-ended bootstrapped T/H circuit 100B via the capacitor 540B. Similarly, the charge injection error at the output terminal 106B of the second single-ended bootstrapped T/H circuit 100B is compensated by the signal from the dummy output terminal 116A of the first single-ended bootstrapped T/H circuit 100A via the capacitor 540A. Thus, the charge injection error at the output terminal 106A of the first single-ended bootstrapped T/H circuit 100A is mostly canceled by the signal from the cross-coupled dummy transistors 114B and 114Bc of the second single-ended bootstrapped T/H circuit 100B. Similarly, the charge injection error at the output terminal 106B of the second single-ended bootstrapped T/H circuit 100B is mostly canceled by the signal from the cross-coupled dummy transistors 114A and 114Ac of the first single-ended bootstrapped T/H circuit 100A. As a result, linearity performance degradation of the output signals $V_{outp}$ and $V_{outn}$ at the output terminals 106A and 106B is reduced.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It can also be noted that at least some of the operations for the methods described herein may be implemented using software instructions stored on a computer useable storage medium for execution by a computer. As an example, an embodiment of a computer program product includes a computer useable storage medium to store a computer readable program.

The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid-state memory, magnetic tape, a removable computer diskette, a random-access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Alternatively, embodiments of the invention may be implemented entirely in hardware or in an implementation containing both hardware and software elements. In embodiments that use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A differential bootstrapped track-and-hold circuit comprising:
a first single-ended bootstrapped track-and-hold circuit including
a first sampling switch connected between a first input terminal and a first output terminal,
a first sampling capacitor connected to the first output terminal, and
a first dummy sampling switch connected between the first input terminal and
a first dummy output terminal,
the first sampling switch and the first dummy sampling switch being controlled by a first bootstrap driver connected to the first input terminal; and
a second single-ended bootstrapped track-and-hold circuit including
a second sampling switch connected between a second input terminal and a second output terminal,
a second sampling capacitor connected to the second output terminal, and
a second dummy sampling switch connected between the second input terminal and a second dummy output terminal,
the second sampling switch and the second dummy sampling switch being controlled by a second bootstrap driver connected to the second input terminal,
wherein the first dummy output terminal of the first single-ended bootstrapped track-and-hold circuit is connected to the second output terminal of the second single-ended bootstrapped track-and-hold circuit;
wherein the second dummy output terminal of the second single-ended bootstrapped track-and-hold circuit is connected to the first output terminal of the first single-ended bootstrapped track-and-hold circuit to provide signals from the first and second dummy sampling switches to compensate for charge injection errors at the first and second output terminals;
wherein the first dummy sampling switch of the first single-ended bootstrapped track-and-hold circuit is connected to the second output terminal of the second single-ended bootstrapped track-and-hold circuit via a first capacitor; and wherein the second dummy sampling switch of the second single-ended bootstrapped track-and-hold circuit is connected to the first output terminal of the first single-ended bootstrapped track-and-hold circuit via a second capacitor.

2. The differential bootstrapped track-and-hold circuit of claim 1, wherein the first sampling switch of the first single-ended bootstrapped track-and-hold circuit is connected to receive a bootstrap signal from the first bootstrap driver, and wherein the first dummy sampling switch of the first single-ended bootstrapped track-and-hold circuit is connected to receive a signal from a plate of a bootstrap capacitor in the first bootstrap driver.

3. The differential bootstrapped track-and-hold circuit of claim 2, wherein the second sampling switch of the second single-ended bootstrapped track-and-hold circuit is connected to receive a bootstrap signal from the second bootstrap driver, and wherein the second dummy sampling switch of the second single-ended bootstrapped track-and-hold circuit is connected to receive a signal from a plate of a bootstrap capacitor in the second bootstrap driver.

4. The differential bootstrapped track-and-hold circuit of claim 1, wherein the first single-ended bootstrapped track-and-hold circuit includes a first cascode sampling switch connected in series with the first sampling switch and a first cascode dummy sampling switch connected in series with the first dummy sampling switch.

5. The differential bootstrapped track-and-hold circuit of claim 4, wherein the first cascode sampling switch of the first single-ended bootstrapped track-and-hold circuit is connected to receive a signal from a first plate of a first bootstrap capacitor in the first bootstrap driver, and wherein the first cascode dummy sampling switch of the first single-ended bootstrapped track-and-hold circuit is connected to receive a signal from a second plate of the first bootstrap capacitor in the first bootstrap driver.

6. The differential bootstrapped track-and-hold circuit of claim 4, wherein the second single-ended bootstrapped track-and-hold circuit includes a second cascode sampling switch connected in series with the second sampling switch and a second cascode dummy sampling switch connected in series with the second dummy sampling switch.

7. The differential bootstrapped track-and-hold circuit of claim 6, wherein the second cascode sampling switch of the second single-ended bootstrapped track-and-hold circuit is connected to receive a signal from a first plate of a second bootstrap capacitor in the second bootstrap driver, and wherein the second cascode dummy sampling switch of the second single-ended bootstrapped track-and-hold circuit is connected to receive a signal from a second plate of the second bootstrap capacitor in the second bootstrap driver.

8. The differential bootstrapped track-and-hold circuit of claim 1, wherein the first bootstrap driver includes a first bootstrap capacitor having a first plate connected to the first input terminal via a first transistor in the first bootstrap driver and having a second plate connected to the first sampling switch via a second transistor in the first bootstrap driver.

9. The differential bootstrapped track-and-hold circuit of claim 8, wherein the second bootstrap driver includes a second bootstrap capacitor having a first plate connected to the second input terminal via a first transistor in the second bootstrap driver and having a second plate connected to the first sampling switch via a second transistor in the second bootstrap driver.

10. The differential bootstrapped track-and-hold circuit of claim 1, wherein the first sampling switch, the first dummy sampling switch, the second sampling switch and the second dummy sampling switch are transistors.

11. The differential bootstrapped track-and-hold circuit of claim 1, wherein the first sampling switch, the first dummy sampling switch, the second sampling switch and the second dummy sampling switch are NMOS transistors.

12. A differential bootstrapped track-and-hold circuit comprising:

a first single-ended bootstrapped track-and-hold circuit including
a first sampling transistor connected between a first input terminal and a first output terminal,
a first sampling capacitor connected to the first output terminal and ground, and
a first dummy sampling transistor connected between the first input terminal and a first dummy output terminal,
the first sampling transistor and the first dummy sampling transistor being controlled by a first bootstrap driver connected to the first input terminal; and a second single-ended bootstrapped track-and-hold circuit including
a second sampling transistor connected between a second input terminal and a second output terminal,
a second sampling capacitor connected to the second output terminal and ground, and
a second dummy sampling transistor connected between the second input terminal and a second dummy output terminal,
the second sampling transistor and the second dummy sampling transistor being controlled by a second bootstrap driver connected to the second input terminal, wherein the first dummy output terminal of the first single-ended bootstrapped track-and-hold circuit is connected to the second output terminal of the second single-ended bootstrapped track-and-hold circuit via a first capacitor and the second dummy output terminal of the second single-ended bootstrapped track-and-hold circuit is connected to the first output terminal of the first single-ended bootstrapped track-and-hold circuit via a second capacitor to provide signals from the first and second dummy sampling transistors to compensate for charge injection errors at the first and second output terminals.

13. The differential bootstrapped track-and-hold circuit of claim 12, wherein the first sampling transistor of the first single-ended bootstrapped track-and-hold circuit is connected to receive a bootstrap signal from the first bootstrap driver, and wherein the first dummy sampling transistor of the first single-ended bootstrapped track-and-hold circuit is connected to receive a signal from a plate of a bootstrap capacitor in the first bootstrap driver.

14. The differential bootstrapped track-and-hold circuit of claim 12, wherein the first single-ended bootstrapped track-and-hold circuit includes a first cascode sampling transistor connected in series with the first sampling transistor and a first cascode dummy sampling transistor connected in series with the first dummy sampling transistor.

15. The differential bootstrapped track-and-hold circuit of claim 14, wherein the first cascode sampling transistor of the first single-ended bootstrapped track-and-hold circuit is connected to receive a signal from a first plate of a first bootstrap capacitor in the first bootstrap driver, and wherein the first cascode dummy sampling transistor of the first single-ended bootstrapped track-and-hold circuit is connected to receive a signal from a second plate of the first bootstrap capacitor in the first bootstrap driver.

16. The differential bootstrapped track-and-hold circuit of claim 14, wherein the second single-ended bootstrapped track-and-hold circuit includes a second cascode sampling transistor connected in series with the second sampling transistor and a second cascode dummy sampling transistor connected in series with the second dummy sampling transistor.

17. The differential bootstrapped track-and-hold circuit of claim 12, wherein the first bootstrap driver includes a first bootstrap capacitor having a first plate connected to the first input terminal via a first transistor in the first bootstrap driver and having a second plate connected to the first sampling transistor via a second transistor in the first bootstrap driver.

18. A differential bootstrapped track-and-hold circuit comprising:

a first single-ended bootstrapped track-and-hold circuit including a first sampling transistor connected between a first input terminal and a first output terminal, a first sampling capacitor between the first output terminal and ground, and a first dummy sampling transistor connected between the first input terminal and a first dummy output terminal, the first single-ended bootstrapped track-and-hold circuit further including a first bootstrap driver connected to the first input terminal and gates of the first sampling transistor and the first dummy sampling transistor; and a second single-ended bootstrapped track-and-hold circuit including a second sampling transistor connected between a second input terminal and a second output terminal, a second sampling capacitor between the second output terminal and ground, and a second dummy sampling transistor connected between the second input terminal and a second dummy output terminal, the second single-ended bootstrapped track-and-hold circuit further including a second bootstrap driver connected to the second input terminal and gates of the second sampling transistor and the second dummy sampling transistor, wherein the first dummy output terminal of the first single-ended bootstrapped track-and-hold circuit is connected to the second output terminal of the second single-ended bootstrapped track-and-hold circuit via a first capacitor and the second dummy output terminal of the second single-ended bootstrapped track-and-hold circuit is connected to the first output terminal of the first single-ended bootstrapped track-and-hold circuit via a second capacitor to produce signals to compensate for charge injection errors at the first and second output terminals.

19. The differential bootstrapped track-and-hold circuit of claim 18, wherein the gate of the first sampling transistor of the first single-ended bootstrapped track-and-hold circuit is connected to receive a bootstrap signal from the first bootstrap driver, and wherein the gate of the first dummy sampling transistor of the first single-ended bootstrapped track-and-hold circuit is connected to receive a signal from a plate of a bootstrap capacitor in the first bootstrap driver.

* * * * *